United States Patent
Ikuta et al.

(10) Patent No.: US 10,727,303 B2
(45) Date of Patent: Jul. 28, 2020

(54) GROUP III NITRIDE EPITAXIAL SUBSTRATE AND METHOD FOR MANUFACTURING THE SAME

(75) Inventors: Tetsuya Ikuta, Tokyo-to (JP); Tomohiko Shibata, Tokyo (JP)

(73) Assignee: DOWA ELECTRONICS MATERIALS CO., LTD., Tokyo (JP)

( * ) Notice: Subject to any disclaimer, the term of this patent is extended or adjusted under 35 U.S.C. 154(b) by 1842 days.

(21) Appl. No.: 14/131,987

(22) PCT Filed: Jul. 11, 2012

(86) PCT No.: PCT/JP2012/004484
§ 371 (c)(1),
(2), (4) Date: Apr. 4, 2014

(87) PCT Pub. No.: WO2013/008461
PCT Pub. Date: Jan. 17, 2013

(65) Prior Publication Data
US 2014/0209862 A1    Jul. 31, 2014

(30) Foreign Application Priority Data
Jul. 11, 2011    (JP) .................. 2011-153132

(51) Int. Cl.
*H01L 29/15*    (2006.01)
*H01L 29/66*    (2006.01)
(Continued)

(52) U.S. Cl.
CPC .............. *H01L 29/15* (2013.01); *C30B 25/02* (2013.01); *C30B 29/403* (2013.01); *C30B 29/68* (2013.01);
(Continued)

(58) Field of Classification Search
CPC ......... H01L 29/66462; H01L 21/02381; H01L 21/021458; H01L 21/02507;
(Continued)

(56) References Cited

U.S. PATENT DOCUMENTS

2009/0200645 A1    8/2009  Kokawa et al.
2010/0243989 A1    9/2010  Makabe et al.
(Continued)

FOREIGN PATENT DOCUMENTS

JP    A-2001-230447    8/2001
JP    A-2007-67077     3/2007
(Continued)

OTHER PUBLICATIONS

Nov. 30, 2015 Office Action issued in Chinese Patent Application No. 201280044074.4.
(Continued)

*Primary Examiner* — Vongsavanh Sengdara
(74) *Attorney, Agent, or Firm* — Oliff PLC

(57) ABSTRACT

Provided is a Group III nitride epitaxial substrate that can suppress the occurrence of breakage during a device formation process and a method for manufacturing the same. A Group III nitride epitaxial substrate according to the present invention includes a Si substrate, an initial layer in contact with the Si substrate, and a superlattice laminate, formed on the initial layer, including a plurality of sets of laminates, each of the laminates including, in order, a first layer made of AlGaN with an Al composition ratio greater than 0.5 and 1 or less and a second layer made of AlGaN with an Al composition ratio greater than 0 and 0.5 or less. The Al composition ratio of the second layer progressively decreases with distance from the substrate.

7 Claims, 2 Drawing Sheets

(51) Int. Cl.
*H01L 29/778* (2006.01)
*H01L 21/02* (2006.01)
*C30B 29/40* (2006.01)
*C30B 29/68* (2006.01)
*C30B 25/02* (2006.01)
*H01L 29/20* (2006.01)
*H01L 33/00* (2010.01)

(52) U.S. Cl.
CPC .... *H01L 21/0254* (2013.01); *H01L 21/02381* (2013.01); *H01L 21/02458* (2013.01); *H01L 21/02507* (2013.01); *H01L 29/155* (2013.01); *H01L 29/66462* (2013.01); *H01L 29/7787* (2013.01); *H01L 29/2003* (2013.01); *H01L 33/007* (2013.01)

(58) Field of Classification Search
CPC ... H01L 21/0254; H01L 29/15; H01L 29/155; H01L 2003/66462; H01L 2003/7787; H01L 33/007; C30B 25/02; C30B 29/403; C30B 29/68
See application file for complete search history.

(56) References Cited

U.S. PATENT DOCUMENTS

2010/0244096 A1* 9/2010 Sato ............... H01L 21/02381
                                                        257/190
2011/0001127 A1* 1/2011 Sakamoto ........ H01L 21/02458
                                                        257/22
2011/0006308 A1   1/2011 Sato

FOREIGN PATENT DOCUMENTS

| | | |
|---|---|---|
| JP | A-2007-221001 | 8/2007 |
| JP | A-2009-158804 | 7/2009 |
| JP | A-2009-188252 | 8/2009 |
| JP | A-2010-232293 | 10/2010 |
| JP | A-2010-232377 | 10/2010 |
| JP | A-2011-18844 | 1/2011 |

OTHER PUBLICATIONS

International Search Report issued in International Patent Application No. PCT/JP2012/004484 dated Sep. 18, 2012.
Oct. 26, 2015 Office Action issued in Taiwanese Patent Application No. 101125050.

* cited by examiner

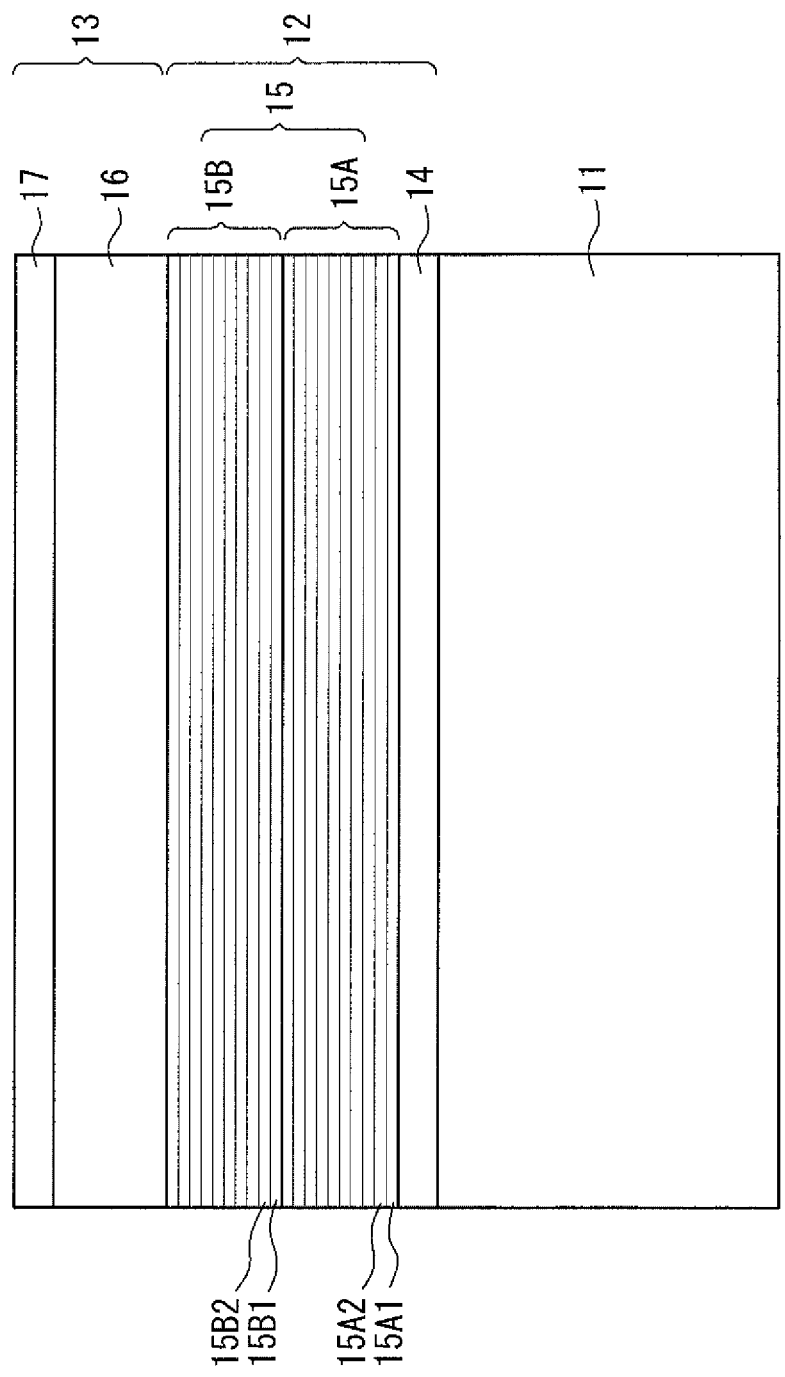

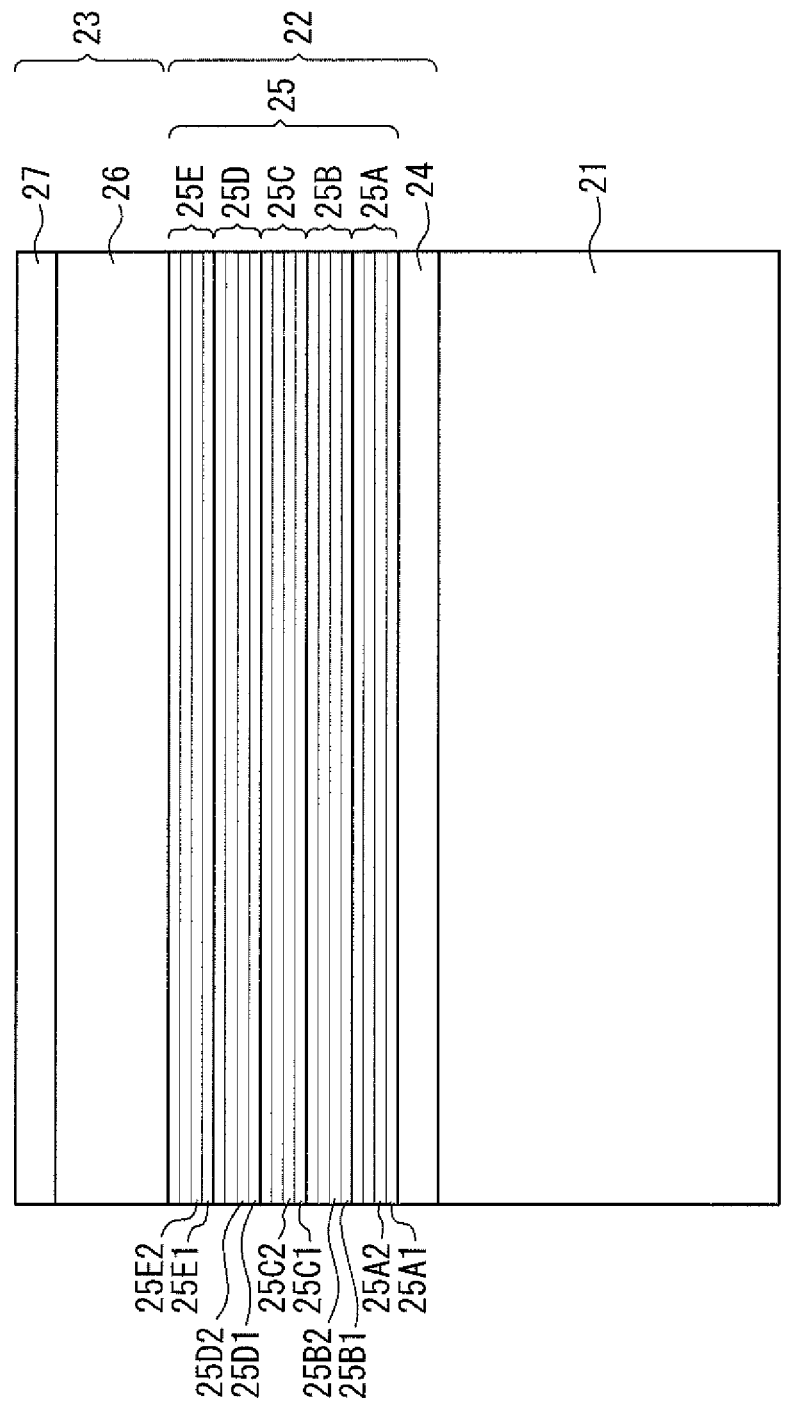

GROUP III NITRIDE EPITAXIAL SUBSTRATE AND METHOD FOR MANUFACTURING THE SAME

TECHNICAL FIELD

The present invention relates to a Group III nitride epitaxial substrate and to a method for manufacturing the same. More particularly, the present invention relates to a Group III nitride epitaxial substrate that can suppress the occurrence of breakage during a device formation process and to a method for manufacturing the same.

BACKGROUND ART

Recently, in general, Group III nitride semiconductors made of compounds of N with Al, Ga, In, and so forth are widely used in light-emitting elements, elements for electronic devices, and the like. The characteristics of such devices are greatly dependent on the crystallinity of Group III nitride semiconductors, making techniques for growing highly crystalline Group III nitride semiconductors necessary.

Group III nitride semiconductors have been formed conventionally by epitaxial growth on sapphire substrates. However, sapphire substrates have poor heat dissipation due to low thermal conductivity, which is not suitable for producing high-power output devices.

Therefore, in recent years, a technique for using a silicon substrate (Si substrate) as a substrate for crystal growth of a Group III nitride semiconductor has been proposed. Si substrates have better heat dissipation than the above sapphire substrates and are therefore suitable for producing high-power output devices. Furthermore, since large substrates are inexpensive, they are advantageous in reducing production cost. However, like sapphire substrates, Si substrates have different lattice constants than Group III nitride semiconductors. Therefore, growing a Group III nitride semiconductor directly on such a Si substrate is not expected to provide a highly crystalline Group III nitride semiconductor.

Furthermore, a Group III nitride semiconductor has a high thermal expansion coefficient in comparison with silicon. Accordingly, when this Group III nitride semiconductor is grown directly on a Si substrate, a great tensile strain occurs in the Group III nitride semiconductor in the course of cooling from the high temperature of a crystal growth process to room temperature. This leads to problems of the Si substrate warping, and to the generation of high-density cracks in the Group III nitride semiconductor.

Therefore, JP2007-67077A (PTL 1) discloses a technique for manufacturing, on a Si substrate, a highly crystalline Group III nitride semiconductor in which generation of cracks is prevented by providing an AlN-based superlattice buffer layer between the silicon substrate and the Group III nitride semiconductor. The AlN-based superlattice buffer layer has a plurality of alternately stacked first layers, made of $Al_xGa_{1-x}N$ (the Al composition ratio x being such that $0.5 \le x \le 1$) and second layers, made of $Al_yGa_{1-y}N$ (the Al composition ratio y being such that $0.01 \le y \le 0.2$).

CITATION LIST

Patent Literature

PTL 1: JP2007-67077A

SUMMARY OF INVENTION

Technical Problem

PTL 1 refers to improving crystallinity and preventing generation of cracks by smoothing the surface of a nitride semiconductor layer at the atomic level. In a state of having formed not only the buffer layer that includes the superlattice on the Si substrate, but also the nitride semiconductor layer (main laminate), the intention is to prevent the occurrence of cracks in the nitride semiconductor layer. In this way, in a substrate after formation of the nitride semiconductor layer, it has conventionally been typical to prevent the occurrence of cracks at the nitride semiconductor layer.

According to examination by the present inventors, warpage due to a buffer layer in which the lattice constants are small and the thermal expansion coefficient is large with respect to the Si substrate may be offset by opposite warpage due to a main laminate in which the lattice constants and the thermal expansion coefficient are larger than those of the buffer layer, so as to form the main laminate on the buffer layer in a state without cracks and to reduce warpage. Even in this case, however, the present inventors discovered that subsequently, during a device formation process, in which electrodes are formed, grooves are formed on the main laminate for singulation, elements are transported, and so forth, a problem arises in that breakage may suddenly occur, and the substrate may unintentionally break up into a plurality of pieces. In other words, conventional structures have only focused on preventing cracks in the wafer stage, before device formation, without taking into consideration subsequent breakage during the device formation process. In the present disclosure, "breakage" refers literally to the substrate breaking up into a plurality of pieces, and a "crack" refers to a crack or fracture that does not cause the substrate to break up into pieces.

The present invention has been conceived in light of the above circumstances, and it is an object thereof to provide a Group III nitride epitaxial substrate that can suppress the occurrence of breakage during a device formation process and a method for manufacturing the same.

Solution to Problem

In further examining how to achieve the above object, the present inventors made the following discoveries. Specifically, the present inventors discovered that regardless of the magnitude of the warpage in a state of having formed the main laminate on the buffer layer that includes the superlattice, if the warpage before formation of the main laminate is large after formation of the buffer layer that includes the superlattice, breakage occurs easily in the device formation process. In other words, in the device formation process, for example the wafer is pressed for exposure accuracy in lithography (application of external stress), or a portion of the nitride semiconductor layer is processed and the stress balance deteriorates (collection of internal stress). Furthermore, shocks are received during transport and positioning, and thermal shocks are received during heat treatment. In order to be able to withstand such stresses, it is necessary to focus not only on reducing the application of external stress due to warpage in a state of having formed the main laminate, but also to reduce internal stress applied to the main laminate to a range capable of resisting external stress and to strengthen resistance to shocks. Otherwise, breakage during the device formation process cannot be suppressed. Therefore, by focusing on the warpage after formation of the buffer layer and before formation of the main laminate, the present inventors conceived of suppressing warpage at the time of forming a buffer layer having a superlattice laminate in order to suppress breakage during the device formation process. The present inventors discovered that this objective can be achieved with the structure described below, thereby completing the present invention.

The present invention has been achieved based on the above discoveries, and the main features thereof are as follows.

(1) A Group III nitride epitaxial substrate including: an Si substrate; an initial layer in contact with the Si substrate; and a superlattice laminate, formed on the initial layer, including a plurality of sets of laminates, each of the laminates including, in order, a first layer made of AlGaN with an Al composition ratio greater than 0.5 and 1 or less and a second layer made of AlGaN with an Al composition ratio greater than 0 and 0.5 or less, wherein the Al composition ratio of the second layer progressively decreases with distance from the substrate.

(2) The Group III nitride epitaxial substrate according to (1), wherein the superlattice laminate includes a plurality of superlattice layers each including a plurality of sets of the first layer and the second layer made of AlGaN with a constant Al composition ratio, the first layer and the second layer being alternately stacked, and the Al composition ratio of the second layer of each superlattice layer in the superlattice laminate is smaller as a position of the superlattice layer is more distant from the Si substrate.

(3) The Group III nitride epitaxial substrate according to (1) or (2), wherein a difference between the Al composition ratio of the second layer closest to the Si substrate and the Al composition ratio of the second layer farthest from the Si substrate is 0.02 or more.

(4) The Group III nitride epitaxial substrate according to any one of (1) to (3), wherein the first layer is AlN.

(5) The Group III nitride epitaxial substrate according to any one of (1) to (4), wherein the initial layer includes an AlN layer and an AlGaN layer on the AlN layer, and an Al composition ratio of the AlGaN layer in the initial layer is larger than the Al composition ratio of the AlGaN layer in the second layer closest to the substrate.

(6) The Group III nitride epitaxial substrate according to any one of (1) to (5), further comprising a main laminate formed by epitaxial growth, on the superlattice laminate, of a Group III nitride layer including at least a GaN layer.

(7) The Group III nitride epitaxial substrate according to any one of (1) to (6), wherein in a state with the superlattice laminate as an uppermost layer, an amount of warpage yielding a convex lower side is 130 μm or less.

(8) A method for manufacturing a Group III nitride epitaxial substrate including: a first step of forming, on an Si substrate, an initial layer in contact with the Si substrate; and a second step of forming a superlattice laminate, on the initial layer, including a plurality of sets of laminates, each of the laminates including, in order, a first layer made of AlGaN with an Al composition ratio greater than 0.5 and 1 or less and a second layer made of AlGaN with an Al composition ratio greater than 0 and 0.5 or less, wherein in the second step, the Al composition ratio of the second layer is caused to decrease progressively with distance from the substrate.

Advantageous Effect of Invention

According to the present invention, by the Al composition ratio of the second layer progressively decreasing with distance from the substrate, warpage of the substrate after formation of the superlattice laminate and before formation of the main laminate can be suppressed. As a result, the occurrence of breakage during a device formation process can be suppressed.

BRIEF DESCRIPTION OF DRAWINGS

The present invention will be further described below with reference to the accompanying drawings, wherein:

FIG. 1 is a schematic cross-sectional view of a Group III nitride epitaxial substrate 10 according to the present invention; and FIG. 2 is a schematic cross-sectional view of another Group III nitride epitaxial substrate 20 according to the present invention.

DESCRIPTION OF EMBODIMENTS

The following describes the present invention in greater detail with reference to the drawings. Note that in the present disclosure, when the two Group III nitride epitaxial substrates that are the embodiments of the present invention share the same structural components, reference numerals, with the same last digit are generally provided, and the description is abbreviated. Furthermore, the schematic cross-sectional views of the substrates are enlarged in the thickness direction for the sake of explanation.

Embodiment 1: Group III Nitride Epitaxial Substrate 10

As illustrated in FIG. 1, a Group III nitride epitaxial substrate 10, which is an embodiment of the present invention, includes an Si substrate 11 and a buffer layer 12 formed on the Si substrate 11. A main laminate 13 formed by epitaxial growth of a Group III nitride layer on the buffer layer 12 may also be provided. The buffer layer 12 includes an initial layer 14, in contact with the Si substrate 11, and a superlattice laminate 15, formed on the initial layer 14, including a plurality of sets of laminates, each of the laminates including, in order, a first layer made of AlGaN with an Al composition ratio greater than 0.5 and 1 or less and a second layer made of AlGaN with an Al composition ratio greater than 0 and 0.5 or less. In the present embodiment, the superlattice laminate 15 includes two superlattice layers: a first superlattice layer 15A and a second superlattice layer 15B. The first superlattice layer 15A includes, for example, a plurality of sets of a first layer 15A1 made of AlN and a second layer 15A2 made of $Al_{0.1}Ga_{0.9}N$ with a constant Al composition ratio of 0.10, the first layer 15A1 and the second layer 15A2 being alternately stacked. The second superlattice layer 15B includes, for example, a plurality of sets of a first layer 15B1 made of AlN and a second layer 15B2 made of $Al_{0.05}Ga_{0.95}N$ with a constant Al composition ratio of 0.05, the first layer 15B1 and the second layer 15B2 being alternately stacked.

The Si substrate 11 is a Si single crystal substrate. The plane direction is not limited in particular, and the (111), (100), and (110) planes or the like may be used. In order to grow the (0001) plane of the Group III nitride, however, the (110) and (111) planes are preferable. Furthermore, in order to achieve growth with good surface evenness, the (111) plane is preferably used. Either p-type or n-type conductivity may be used, and any resistivity from 0.001 Ω·cm to 100000 Ω·cm is applicable. The Si substrate may also contain impurities (C, O, N, Ge, and the like) for purposes other than controlling electrical conductivity. The thickness of the substrate is set as appropriate considering the amount of warpage and the like after epitaxial growth of each layer and is, for example, in a range of 500 µm to 2000 µm.

Typical materials for forming the initial layer 14 include AlGaN and AlN. In particular, using an AlN layer for the portion of the initial layer 14 in contact with the substrate suppresses reaction with the Si substrate 11 and improves vertical withstand voltage. The initial layer 14 does not necessarily have a uniform composition in the thickness direction, and when a portion thereof in contact with the substrate is an AlN layer, the initial layer 14 may be a laminate of a plurality of layers having different compositions, such as by forming an AlGaN layer on the AlN layer, or its composition may be graded. A thin film of nitride, oxide, carbide, or the like of Si, or a thin film obtained by reaction of AlN with such a film, may be inserted at the interface portion between the AlN and the Si single crystal substrate. Furthermore, for the initial layer 14, an amorphous layer or a polycrystalline layer such as a low temperature buffer layer, for example, can be formed with a thickness that does not impair crystal quality. The thickness of the initial layer 14 is, for example, in a range of 10 nm to 500 nm. The reason is that when the thickness is less than 10 nm, defects may occur due to the Ga, which is a part of the source material for the upper layer, reacting with the Si substrate, and when the thickness exceeds 500 nm, cracks may occur at the time the initial layer is formed.

In the present embodiment, the Al composition ratio of the second layer 15A2 in the first superlattice layer 15A is 0.1, and the Al composition ratio of the second layer 15B2 in the second superlattice layer 15B is 0.05. A characteristic feature is therefore that the Al composition ratio of the second layer decreases with distance from the Si substrate 11. The present inventors discovered that in such a superlattice laminate having an AlGaN layer (including AlN) with a high Al composition ratio and an AlGaN layer with a low Al composition ratio, causing the Al composition ratio of the AlGaN layer with the low Al composition ratio to decrease with distance from the substrate can suppress warpage of the substrate in a state of having formed the superlattice laminate 15, i.e. can suppress warpage in a state with the superlattice laminate 15 as the uppermost layer. As a result, at the stage after subsequently forming a main laminate from a nitride semiconductor layer and then performing a device formation process, the occurrence of breakage in the substrate can be suppressed.

The present invention is not constrained by theory, yet the above effects are thought to be achieved due to actions such as those below. Specifically, since the thermal expansion coefficient of a Group III nitride semiconductor forming a superlattice laminate is far larger than the thermal expansion coefficient of a Si substrate, when growing the superlattice laminate on the Si substrate, a great tensile strain occurs in the superlattice laminate in the course of cooling from a high-temperature growth process to room temperature. A force thus acts in a direction to warp the substrate with the Si substrate side being convex. Below, warpage with the Si substrate side being convex is referred to as "warpage yielding a convex lower side", and conversely warpage with the superlattice laminate side being convex is referred to as "warpage yielding a convex upper side". As the Al composition ratio of the AlGaN decreases, the lattice constants that the material itself inherently has become large. Therefore, when the Al composition ratio of the second layer decreases with distance from the substrate, as in the present invention, then as the second layer is farther from the substrate, i.e. closer to the upper side, there are more layers with smaller lattice constants (a large difference in lattice constants) below that second layer. During growth, the in-plane crystal lattice thus grows while shrinking. As a result, during growth of the superlattice laminate (in a high-temperature state), compressive stress acts increasingly within the film in a second layer closer to the upper side and the film attempts to expand. Hence, a force acts on the substrate to cause warpage yielding a convex upper side. Therefore, it is considered that the force for warpage yielding a convex upper side during a high-temperature state (compressive stress) and the force for warpage yielding a convex lower side during the cooling process (tensile stress) offset each other, suppressing warpage of the substrate in a state of having formed the superlattice laminate 15. It is considered that if the Al composition ratio of the second layer 15B2 in the second superlattice layer 15B were also 0.1, the compressive stress in a high-temperature state would be insufficient, causing a large amount of tensile stress to remain in the substrate in a state of having formed the superlattice laminate 15 and leading to great warpage at the lower side.

When tensile stress remains in the superlattice laminate, then even if warpage is suppressed after formation of the main laminate, the compressive stress of the main laminate and the tensile stress of the superlattice laminate simply offset each other, and a large tensile stress still acts on the superlattice laminate. Therefore, during a device formation process, if the film thickness of the main laminate is locally reduced, for example by etching the main laminate, the balance of forces deteriorates locally at that portion, and it is thought that breakage occurs with that portion as the starting point. According to the present invention, however, the tensile stress in the superlattice laminate is reduced, and therefore such a starting point for breakage does not occur, so that breakage during the device formation process can be suppressed.

The main laminate 13 is formed by epitaxial growth of a Group III nitride layer including at least GaN on the buffer layer 12. In the present embodiment, the main laminate 13 includes a channel layer 16 made of GaN and formed on the second superlattice layer 15B, and an electron supply layer 17 that is made of AlGaN, has a larger band gap than the channel layer, and is formed on the channel layer 16. To avoid alloy scattering at a portion where 2D electron gas occurs, a GaN layer in the main laminate 13 is preferably positioned furthest towards the electron supply layer 17, as in the present embodiment. The layer directly above the superlattice laminate 15 is preferably GaN or AlGaN having a lower Al composition than the uppermost second layer in the superlattice laminate 15, so that compressive stress enters into the layer. In the present invention, the thickness of the main laminate 13 is preferably in a range from 0.1 µm to 5 µm. The reason is that when the thickness is less than 0.1 µm, defects such as pits may occur, and when the thickness exceeds 5 µm, cracks may occur in the main laminate 13. The thickness of the channel layer 16 and the electron supply layer 17 may be set appropriately for the device design.

The Group III nitride epitaxial substrate 10 of the present embodiment may be used in any electronic device and particularly is preferably used in a High Electron Mobility Transistor (HEMT).

Examples of the process for device formation of the Group III nitride epitaxial substrate 10 according to the present invention include a process to form electrodes on the substrate 10, a process to form grooves by etching for singulation of the nitride semiconductor layer, a process to form a surface passivation film, a process to separate elements, and the like. In each process, elements are transported.

Embodiment 2: Group III Nitride Epitaxial Substrate 20

As illustrated in FIG. 2, a Group III nitride epitaxial substrate 20, which is another embodiment of the present invention, includes an Si substrate 21 and a buffer layer 22 formed on the Si substrate 21. A main laminate 23 formed by epitaxial growth of a Group III nitride layer on the buffer layer 22 may also be provided. The buffer layer 22 includes an initial layer 24, in contact with the Si substrate 11, and a superlattice laminate 25, formed on the initial layer 24, including a plurality of sets of laminates, each of the laminates including, in order, a first layer made of AlGaN with an Al composition ratio greater than 0.5 and 1 or less and a second layer made of AlGaN with an Al composition ratio greater than 0 and 0.5 or less. In the present embodiment, the superlattice laminate 25 includes five superlattice layers: a first superlattice layer 25A, a second superlattice layer 25B, a third superlattice layer 25C, a fourth superlattice layer 25D, and a fifth superlattice layer 25E. The first superlattice layer 25A includes, for example, a plurality of sets of a first layer 25A1 made of AlN and a second layer 25A2 made of $Al_{0.1}Ga_{0.9}N$ with a constant Al composition ratio of 0.10, the first layer 25A1 and the second layer 25A2 being alternately stacked. The second superlattice layer 25B includes, for example, a plurality of sets of a first layer 25B1 made of AlN and a second layer 25B2 made of $Al_{0.09}Ga_{0.92}N$ with a constant Al composition ratio of 0.08, the first layer 25B1 and the second layer 25B2 being alternately stacked. The third superlattice layer 25C includes, for example, a plurality of sets of a first layer 25C1 made of AlN and a second layer 25C2 made of $Al_{0.06}Ga_{0.94}N$ with a constant Al composition ratio of 0.06, the first layer 25C1 and the second layer 25C2 being alternately stacked. The fourth superlattice layer 25D includes, for example, a plurality of sets of a first layer 25D1 made of AlN and a second layer 25D2 made of $Al_{0.04}Ga_{0.96}N$ with a constant Al composition ratio of 0.04, the first layer 25D1 and the second layer 25D2 being alternately stacked. The fifth superlattice layer 25E includes, for example, a plurality of sets of a first layer 25E1 made of AlN and a second layer 25E2 made of $Al_{0.02}Ga_{0.98}N$ with a constant Al composition ratio of 0.02, the first layer 25E1 and the second layer 25E2 being alternately stacked.

In the present embodiment as well, the Al composition ratio of the second layers 25A2 to 25E2 in the superlattice layers 25A to 25E decreases with distance from the Si substrate 21 as follows: 0.10>0.08>0.06>0.04>0.02. As in Embodiment 1, warpage of the substrate in a state of having formed the superlattice laminate 25 can be suppressed.

The Si substrate 21, initial layer 24, channel layer 26, and electron supply layer 27 are similar to Embodiment 1.

Other Embodiments

All of the above are examples of representative embodiments. The present invention is in no way limited to these embodiments and also includes embodiments such as the following, for example.

In the superlattice laminates 15 and 25 of Embodiments 1 and 2, examples are illustrated in which a plurality of superlattice layers are provided. In each superlattice layer, the first layer is AlN, and the constant Al composition ratio of the second layer made of AlGaN in each superlattice layer decreases with distance from the substrate. The following, however, may for example be adopted as a modification to the Al composition ratio in the superlattice laminate, For example, in a superlattice laminate formed by a plurality of sets of a first layer made of AlN and a second layer made of AlGaN, the first layer and the second layer being alternately stacked, the Al composition ratio of the second layer may progressively decrease with distance from the substrate. In this context, "progressively decrease" refers to a continuous or a step-wise decrease, and in addition to the case of the Al composition ratio of the second layer decreasing step-wise due to a plurality of superlattice layers as above, this term includes the case of the Al composition ratio of a certain second layer and the Al composition ratio of the adjacent second layer, with a first layer therebetween, decreasing continuously. In this case where the second layer decreases continuously, the effects described in Embodiment 1 are also obviously achieved.

In the present invention, the second layer is made of AlGaN, with an Al composition ratio greater than 0 and 0.5 or less, and the first layer is made of AlGaN, with an Al composition ratio greater than 0.5 and 1 or less. Therefore, every second layer has a lower Al composition ratio than the first layers, regardless of whether the second layer is close to or far from the element. Accordingly, in the present invention, the composition of the first layer (AlN in Embodiments 1 and 2) need not be identical at any distance from the element, and the composition among a plurality of first layers may be varied in a range greater than 0.5 and 1 or less.

In the present invention, however, as illustrated in Embodiments 1 and 2, all of the first layers are preferably made of AlN. The reason is that the difference in Al composition ratio from the adjacent second layers is thus maximized, thereby maximizing the strain buffer effect.

In the present invention, the second layer is not particularly limited as long as the second layer is AlGaN with an Al composition ratio greater than 0 and 0.5 or less. Among the second layers, however, the Al composition ratio X of the AlGaN layer closest to the Si substrate is preferably in a range of 0.08 to 0.5. The reason is that when X is less than 0.08, it might not be possible to guarantee sufficient vertical withstand voltage, and when X exceeds 0.5, the strain buffer effect becomes insufficient, and cracks may occur in the superlattice laminate.

In the present invention, the Al composition ratio Y of the AlGaN layer, among the second layers, that is farthest from the Si substrate never becomes zero. In other words, the second layer is never made of GaN. The reason is that if the second layer is made of GaN, the vertical withstand voltage of the element cannot be sufficiently guaranteed. Furthermore, if the vertical withstand voltage is particularly crucial, Y is preferably 0.05 or more from the perspective of guaranteeing the vertical withstand voltage of the element.

In the present invention, regarding the relationship between the Al composition ratio X of the AlGaN layer, among the second layers, that is closest to the Si substrate and the Al composition ratio Y of the AlGaN layer, among the second layers, that is farthest from the Si substrate, the difference (X−Y) is preferably 0.02 or more. The reason is that if the difference is less than 0.02, the effect of suppressing warpage might be insufficient. Furthermore, the difference (X−Y) is preferably 0.45 or less and more preferably 0.2 or less.

When the initial layer 14 includes an AlN layer and an AlGaN layer on the AlN layer, the Al composition ratio Z of the AlGaN layer in the initial layer 14 is preferably larger than the Al composition ratio X of the AlGaN layer, among the second layers, that is closest to the Si substrate. The reason is that by setting Z>X, the tensile stress of the superlattice layer can be suppressed, and the occurrence of cracks in the superlattice laminate can be suppressed.

In the present description, the "AlGaN" forming the buffer layer may include a total of 1% or less of the other Group III elements B and/or In. Furthermore, trace impurities of, for example, Si, H, O, C, Mg, As, P, and the like may be included. The GaN and AlGaN forming the main laminate may similarly include a total of 1% or less of another Group III element.

In the present invention, the thickness of a set of laminates in the superlattice laminate (the first layer and second layer in Embodiments 1 and 2) is set appropriately for a combination of compositions and may, for example, be approximately from 1 nm to 100 nm. The thickness of the first layer can be set from 0.5 nm to 200 nm, and the thickness of the second layer can be set from 0.5 nm to 100 nm.

In the present invention, the number of sets of laminates (first layer and second layer) in the superlattice laminate is set appropriately in accordance with the required withstand voltage and may, for example, be 40 to 300 sets. Furthermore, the thickness of the entire superlattice laminate is preferably 1 μm or more. The reason is that when the thickness is 1 μm or more, the sum of the stresses occurring within the film becomes sufficiently large, thus sufficiently achieving the effects of the present invention.

Method for Manufacturing Group III Nitride Epitaxial Substrate

Next, an embodiment of a method for manufacturing a Group III nitride epitaxial substrate according to the present invention is described. The method for manufacturing a Group III nitride epitaxial substrate according to the present invention includes a first step of forming, on the Si substrate 11, the initial layer 14 in contact with the Si substrate 11, and a second step of forming the superlattice laminate 15, on the initial layer 14, including a plurality of sets of laminates, each of the laminates including, in order, the first layer 15A1 (15B1) made of AlGaN with an Al composition ratio greater than 0.5 and 1 or less and the second layer 15A2 (15B2) made of AlGaN with an Al composition ratio greater than 0 and 0.5 or less, for example as illustrated in FIG. 1. In the second step, the Al composition ratio of the second layer is caused to decrease more in the second superlattice layer 15B than the o first superlattice layer 15A, i.e. progressively with distance from the Si substrate 11. As a result, warpage of the substrate in a state of having formed the superlattice laminate 15 can be suppressed, and at the stage after subsequently forming a main laminate from a nitride semiconductor layer and then performing a device formation process, the occurrence of breakage can be suppressed.

A well-known method, such as MOCVD, MBE, or the like, may be used as the method for epitaxial growth of each layer in the present invention. Examples of the source gas when forming AlGaN include TMA (trimethylaluminum), TMG (trimethylgallium), and ammonia. The Al composition ratio in the film can be controlled by controlling the mixing ratio of TMA and TMG. The Al composition ratio and film thickness after epitaxial growth can also be evaluated using a well-known method such as TEM-EDS.

Next, the present invention is described in further detail with examples, yet the present invention is in no way limited to the following examples.

EXAMPLES

Example 1

On a 6 inch (111) p-type Si single crystal substrate (B-doped, specific resistance: 0.02 Ω·cm, thickness: 625 μm), an initial layer in which AlN (thickness: 120 nm) and $Al_{0.3}Ga_{0.7}N$ (thickness: 50 nm) were sequentially stacked was formed as a buffer layer. Subsequently, on the initial layer, a first superlattice layer with 50 sets of alternately stacked AlN (thickness: 4.5 nm) and $Al_{0.1}Ga_{0.9}N$ (thickness: 21 nm) and a second superlattice layer with 50 sets of alternately stacked AlN (thickness: 4.5 nm) and $Al_{0.05}Ga_{0.95}N$ (thickness: 21 nm) were epitaxially grown in order to yield a superlattice laminate. Subsequently, on the superlattice laminate, a GaN channel layer (thickness: 1.2 μm) and an $Al_{0.25}Ga_{0.75}N$ electron supply layer (thickness: 30 nm) were epitaxially grown to produce a Group III nitride epitaxial substrate as in Embodiment 1 with a HEMT structure. The combination of this channel layer and electron supply layer is referred to as a "semiconductor layer 1". As the growth method, MOCVD using TMA (trimethylaluminum), TMG (trimethylgallium), and ammonia as the source material was used. Nitrogen and hydrogen were used as the carrier gas. The growth conditions for each to layer (pressure and temperature) were, in every case, set to 20 kPa, 1000° C., and a V/III ratio of 2000. The supply amount of organometallic gas when growing the second layer was adjusted to be the same mole ratio as the film composition for each of the first superlattice layer and the second superlattice layer.

A Group III nitride epitaxial substrate was produced in a similar way as above, except that instead of the semiconductor layer 1, a semiconductor layer 2 was formed by epitaxially growing $Al_{0.02}Ga_{0.98}N$ (thickness: 1 μm), a GaN channel layer (thickness: 50 nm), and an $Al_{0.25}Ga_{0.75}N$ electron supply layer (thickness: 30 nm).

Furthermore, a Group III nitride epitaxial substrate was produced in a similar way as above, except that instead of the semiconductor layer 1, a semiconductor layer 3 was formed by epitaxially growing $Al_{0.15}Ga_{0.85}N$ (thickness: 1 μm), a GaN channel layer (thickness: 20 nm), and an $Al_{0.25}Ga_{0.75}N$ electron supply layer (thickness: 30 nm).

Example 2

Three types of a Group III nitride epitaxial substrate as in Embodiment 2 with a HEMT structure were produced in a similar way as in Example 1, except that the superlattice laminate was produced by epitaxially growing, in order, a first superlattice layer with 20 sets of alternately stacked AlN (thickness: 4.5 nm) and $Al_{0.1}Ga_{0.9}N$ (thickness: 21 nm), a second superlattice layer with 20 sets of alternately stacked MN (thickness: 4.5 nm) and $Al_{0.08}Ga_{0.92}N$ (thickness: 21 nm), a third superlattice layer with 20 sets of alternately stacked AlN (thickness: 4.5 nm) and $Al_{0.06}Ga_{0.94}N$ (thickness: 21 nm), a fourth superlattice layer with 20 sets of alternately stacked AlN (thickness: 4.5 nm) and $Al_{0.04}Ga_{0.96}N$ (thickness: 21 nm), and a fifth superlattice layer with 20 sets of alternately stacked AlN (thickness: 4.5 nm) and $Al_{0.02}Ga_{0.98}N$ (thickness: 21 nm). The growth temperature and growth pressure were similar to those of Example 1, and control of the Al composition ratio in the second layers was performed by appropriately controlling the mixing ratio of TMA and TMG. The same is true for the Examples and Comparative Examples below.

Example 3

Three types of a Group III nitride epitaxial substrate with a HEMT structure were produced in a similar way as in Example 1, except that the superlattice laminate was produced by epitaxially growing, in order, a first superlattice layer with 20 sets of alternately stacked AlN (thickness: 4.5 nm) and $Al_{0.14}Ga_{0.86}N$ (thickness: 21 nm), a second superlattice layer with 20 sets of alternately stacked AlN (thickness: 4.5 nm) and $Al_{0.13}Ga_{0.87}N$ (thickness: 21 nm), a third superlattice layer with 20 sets of alternately stacked AlN (thickness: 4.5 nm) and $Al_{0.12}Ga_{0.88}N$ (thickness: 21 nm), a fourth superlattice layer with 20 sets of alternately stacked AlN (thickness: 4.5 nm) and $Al_{0.11}Ga_{0.89}N$ (thickness: 21 nm), and a fifth superlattice layer with 20 sets of alternately stacked AlN (thickness: 4.5 nm) and $Al_{0.10}Ga_{0.90}N$ (thickness: 21 nm).

Comparative Example 1

Three types of a Group III nitride epitaxial substrate according to Comparative Example 1 with a HEMT structure were produced in a similar way as in Example 1, except that the superlattice laminate was produced by epitaxially growing 100 sets of alternately stacked AlN (thickness: 4.5 nm) and $Al_{0.1}Ga_{0.9}N$ (thickness: 21 nm).

Comparative Example 2

Three types of a Group III nitride epitaxial substrate according to Comparative Example 2 with a HEMT structure were produced in a similar way as in Example 1, except that the superlattice laminate was produced by epitaxially growing 100 sets of alternately stacked AlN (thickness: 4.5 nm) and $Al_{0.05}Ga_{0.95}N$ (thickness: 21 nm).

Comparative Example 3

Three types of a Group III nitride epitaxial substrate according to Comparative Example 3 with a HEMT structure were produced in a similar way as in Example 1, except that the superlattice laminate was produced by epitaxially growing 100 sets of alternately stacked AlN (thickness: 4.5 nm) and GaN (thickness: 21 nm).

Comparative Example 4

Three types of a Group III nitride epitaxial substrate according to Comparative Example 4 with a HEMT structure were produced in a similar way as in Example 1, except that the superlattice laminate was produced by epitaxially growing, in order, a first superlattice layer with 50 sets of alternately stacked AlN (thickness: 4.5 nm) and $Al_{0.05}Ga_{0.95}N$ (thickness: 21 nm) and a second superlattice layer with 50 sets of alternately stacked AlN (thickness: 4.5 nm) and $Al_{0.1}Ga_{0.9}N$ (thickness: 21 nm).

(Evaluation 1: Measurement of Substrate Warpage)

Using a warpage measurement device (FT-900, produced by Nidek Co., Ltd.) based on an optical interference method, after formation of the superlattice laminate and before formation of the semiconductor layer, the warpage A of the substrate was measured in accordance with SEMI standards. Table 1 lists the measurement results. The "amount of warpage" in the present invention refers to the amount measured in accordance with SEMI standards. The warpage B after formation of the three types of semiconductor layers was also measured with the same method and is listed in Table 1. Note that in Table 1, warpage yielding a convex lower side is represented with a minus sign, "−", and warpage yielding a convex upper side is represented by a plus sign, "+".

(Evaluation 2: Measurement of Breakage During Device Process)

Ten of the Example and Comparative Example substrates were prepared, and the following device formation process was performed on these substrates. First, electrodes were formed on the substrates, and then grooves were formed by etching for singulation of the nitride semiconductor layer. The 10 substrates of each of the Examples and Comparative Examples were tested to determine the number in which breakage occurred. Table 1 lists the test results.

(Evaluation 3: Measurement of Vertical Withstand Voltage)

An 80 μm φ ohmic electrode with a Ti/Au layered structure was formed on the electron supply layer, and after etching to a thickness of 50 nm on the outside of the ohmic electrode, the back face of the Si substrate was grounded to a metal plate, and the value of the current flowing between electrodes was measured with respect to the voltage. At this point, in order to suppress discharge in the air, an insulating oil was used to insulate between the electrodes. Furthermore, in order to eliminate the effects of leakage to the back face of the substrate, an insulating plate was provided below the substrate. In the present experimental examples, the vertical withstand voltage was set to the voltage at which the value of the current in the vertical direction reached $10^{-4}$ $A/cm^2$ when converted to a value per unit area over the area of the ohmic electrode.

TABLE 1

|  | | Addition of semiconductor layer 1 | | Addition of semiconductor layer 2 | | Addition of semiconductor layer 3 | | Vertical withstand voltage (V) |
| --- | --- | --- | --- | --- | --- | --- | --- | --- |
|  | Warpage A (μm) | Warpage B (μm) | Breakage (number of substrates) | Warpage B (μm) | Breakage (number of substrates) | Warpage B (μm) | Breakage (number of substrates) | |
| Example 1 | −110 | +10 | 0 | −30 | 0 | +50 | 0 | 400 |
| Example 2 | −70 | +40 | 0 | +10 | 0 | +80 | 0 | 200 |
| Example 3 | −110 | +10 | 0 | −30 | 0 | +50 | 0 | 600 |
| Comparative Example 1 | −150 | −30 | 1 | −50 | 1 | +10 | 1 | 600 |
| Comparative Example 2 | −140 | −20 | 1 | −40 | 1 | +20 | 1 | 200 |

TABLE 1-continued

|  | Addition of semiconductor layer 1 | | | Addition of semiconductor layer 2 | | Addition of semiconductor layer 3 | | Vertical withstand voltage (V) |
|---|---|---|---|---|---|---|---|---|
|  | Warpage A (μm) | Warpage B (μm) | Breakage (number of substrates) | Warpage B (μm) | Breakage (number of substrates) | Warpage B (μm) | Breakage (number of substrates) |  |
| Comparative Example 3 | −200 | −100 | 3 | −130 | 3 | −60 | 3 | 200 |
| Comparative Example 4 | −250 | −130 | 8 | −150 | 8 | −90 | 8 | 200 |

As illustrated in Table 1, after formation of the superlattice laminate and before formation of the semiconductor layer, the amount of warpage A of the substrate could be made smaller in the Examples than in the Comparative Examples. As a result, in the Examples, breakage did not occur after the device formation step in any of the 10 sample substrates, whereas in the Comparative Examples, breakage did occur in the samples. Furthermore, for a higher Al composition of the superlattice layer closer to the semiconductor layer, the vertical withstand voltage tended to be higher.

INDUSTRIAL APPLICABILITY

According to the present invention, by the Al composition ratio of the second layer decreasing with distance from the substrate, warpage of the substrate after formation of the superlattice laminate and before formation of the main laminate can be suppressed. As a result, the occurrence of breakage during a device formation process can be suppressed.

REFERENCE SIGNS LIST

10: Group III nitride epitaxial substrate
11: Si substrate
12: Buffer layer
13: Main laminate
14: Initial layer
15: Superlattice laminate
15A: First superlattice layer
15A1: First layer (AlN)
15A2: Second layer ($Al_{0.1}Ga_{0.9}N$)
15B: Second superlattice layer
15B1: First layer (AlN)
15B2: Second layer ($Al_{0.05}Ga_{0.95}N$)
16: Channel layer (GaN)
17: Electron supply layer (AlGaN)

The invention claimed is:

1. A Group III nitride epitaxial substrate comprising:
an Si substrate;
an initial layer in contact with the Si substrate; and
a superlattice laminate, formed on the initial layer, comprising a plurality of sets of laminates, each of the sets of laminates comprising, in order, a first layer made of AlN and/or AlGaN with an Al composition ratio greater than 0.5 and less than 1 and a second layer made of AlGaN with an Al composition ratio greater than 0 and 0.5 or less, wherein the Al composition ratio of the second layer made of AlGaN with an Al composition ratio greater than 0 and 0.5 or less progressively decreases with distance from the Si substrate, and
a difference between the Al composition ratio of the second layer made of AlGaN with an Al composition ratio greater than 0 and 0.5 or less closest to the Si substrate and the Al composition ratio of the second layer made of AlGaN with an Al composition ratio greater than 0 and 0.5 or less farthest from the Si substrate is 0.02 or more to 0.45 or less.

2. The Group III nitride epitaxial substrate according to claim 1, wherein
the superlattice laminate includes a plurality of superlattice layers each comprising a plurality of sets of the first layer and the second layer made of AlGaN with a constant Al composition ratio, the first layer and the second layer being alternately stacked, and
the Al composition ratio of the second layer of each superlattice layer in the superlattice laminate is smaller as a position of the superlattice layer is more distant from the Si substrate.

3. The Group III nitride epitaxial substrate according to claim 1, wherein the first layer is AlN.

4. The Group III nitride epitaxial substrate according to claim 1, wherein the initial layer includes an AlN layer and an AlGaN layer on the AlN layer, and an Al composition ratio of the AlGaN layer in the initial layer is larger than the Al composition ratio of the AlGaN layer in the second layer closest to the substrate.

5. The Group III nitride epitaxial substrate according to claim 1, further comprising a main laminate formed by epitaxial growth, on the superlattice laminate, of a Group III nitride layer comprising at least a GaN layer.

6. The Group III nitride epitaxial substrate according to claim 1, wherein in a state with the superlattice laminate as an uppermost layer, an amount of warpage yielding a convex lower side is 130 μm or less.

7. A method for manufacturing a Group III nitride epitaxial substrate comprising:
a first step of forming, on an Si substrate, an initial layer in contact with the Si substrate; and
a second step of forming a superlattice laminate, on the initial layer, comprising a plurality of sets of laminates, each of the sets of laminates comprising, in order, a first layer made of AlN and/or AlGaN with an Al composition ratio greater than 0.5 and less than 1 and a second layer made of AlGaN with an Al composition ratio greater than 0 and 0.5 or less, wherein.

* * * * *